US008455178B2

(12) United States Patent
Zampini et al.

(10) Patent No.: US 8,455,178 B2
(45) Date of Patent: Jun. 4, 2013

(54) COATING COMPOSITIONS FOR PHOTOLITHOGRAPHY

(75) Inventors: Anthony Zampini, Westborough, MA (US); Michael K. Gallagher, Hopkinton, MA (US); Vipul Jain, Marlborough, MA (US); Owendi Ongayi, Marlborough, MA (US)

(73) Assignee: Rohm and Haas Electronic Materials LLP, Marlborough, MA (US)

( * ) Notice: Subject to any disclaimer, the term of this patent is extended or adjusted under 35 U.S.C. 154(b) by 0 days.

(21) Appl. No.: 11/904,028

(22) Filed: Sep. 25, 2007

(65) Prior Publication Data

US 2008/0073754 A1 Mar. 27, 2008

Related U.S. Application Data

(60) Provisional application No. 60/847,575, filed on Sep. 26, 2006.

(51) Int. Cl.
*G03F 7/00* (2006.01)
*G03F 7/26* (2006.01)

(52) U.S. Cl.
USPC ........................................................ 430/311

(58) Field of Classification Search
USPC ..................................................... 430/270.1
See application file for complete search history.

(56) References Cited

U.S. PATENT DOCUMENTS

| | | | |
|---|---|---|---|
| 4,451,971 A * | 6/1984 | Milgram | 438/670 |
| 4,968,581 A * | 11/1990 | Wu et al. | 430/192 |
| 5,594,086 A | 1/1997 | Vicari | |
| 5,879,853 A | 3/1999 | Azuma | |
| 6,399,273 B1 * | 6/2002 | Yamada et al. | 430/270.1 |
| 7,776,506 B2 * | 8/2010 | Wang et al. | 430/270.1 |
| 2005/0181299 A1 * | 8/2005 | Trefonas et al. | 430/270.1 |
| 2006/0057491 A1 * | 3/2006 | Wayton et al. | 430/270.1 |
| 2006/0068335 A1 * | 3/2006 | Coley et al. | 430/330 |
| 2006/0275696 A1 * | 12/2006 | Zampini et al. | 430/270.1 |
| 2007/0072112 A1 * | 3/2007 | Prokopowicz et al. | 430/270.1 |
| 2007/0238029 A1 * | 10/2007 | Takei et al. | 430/5 |

FOREIGN PATENT DOCUMENTS

| | | |
|---|---|---|
| EP | 0 341 843 | 4/1989 |
| EP | 0341843 A2 * | 4/1989 |
| EP | 0 583 205 | 8/1998 |
| EP | 0 917 002 | 3/2004 |
| EP | 1 237 042 | 11/2005 |
| JP | 2004274020 A * | 9/2004 |
| WO | WO 2006003850 A1 * | 1/2006 |

OTHER PUBLICATIONS

European Search Report of corresponding European Patent Application No. EP 07 11 7113, Oct. 11, 2008.

* cited by examiner

*Primary Examiner* — Cynthia Kelly
*Assistant Examiner* — Chanceity Robinson
(74) *Attorney, Agent, or Firm* — Peter F. Corless; Darryl P. Frickey; Edwards Wildman Palmer LLP

(57) ABSTRACT

Underlying coating compositions are provided that comprise one or more resins comprising one or more modified imide groups. These coating compositions are particularly useful as antireflective layers for an overcoated photoresist layer. Preferred systems can be thermally treated to increase hydrophilicity of the composition coating layer to inhibit undesired intermixing with an overcoated organic composition layer, while rendering the composition coating layer removable with aqueous alkaline photoresist developer.

7 Claims, 1 Drawing Sheet

COATING COMPOSITIONS FOR PHOTOLITHOGRAPHY

Figure 1A:
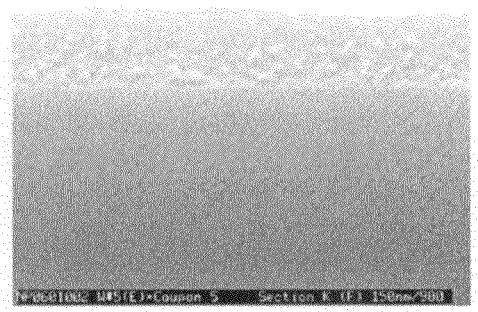

This invention relates generally to the field of manufacture of electronic devices. In particular, this invention relates to the manufacture of integrated circuit devices containing through use of new compositions and processes.

The present invention involves compositions (including antireflective coating compositions or "ARCs") that can reduce reflection of exposing radiation from a substrate back into an overcoated photoresist layer and/or function as a planarizing or via-fill layer. More particularly, the invention relates to organic coating compositions, particularly antireflective coating compositions, that comprise one or more resins that comprise modified imide groups such as modified glutarimide and/or maleimide groups.

Photoresists are photosensitive films used for the transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photo-induced or chemical transformation of the photoresist coating to thereby transfer the pattern of the photomask to the photoresist-coated substrate. Following exposure, the photoresist is developed to provide a relief image that permits selective processing of a substrate.

A major use of photoresists is in semiconductor manufacture where an object is to convert a highly polished semiconductor slice, such as silicon or gallium arsenide, into a complex matrix of electron conducting paths, preferably of micron or submicron geometry, that perform circuit functions. Proper photoresist processing is a key to attaining this object. While there is a strong interdependency among the various photoresist processing steps, exposure is believed to be one of the most important steps in attaining high resolution photoresist images.

Reflection of activating radiation used to expose a photoresist often poses limits on resolution of the image patterned in the photoresist layer. Reflection of radiation from the substrate/photoresist interface can produce spatial variations in the radiation intensity in the photoresist, resulting in non-uniform photoresist linewidth upon development. Radiation also can scatter from the substrate/photoresist interface into regions of the photoresist where exposure is non intended, again resulting in linewidth variations. The amount of scattering and reflection will typically vary from region to region, resulting in further linewidth non-uniformity. Variations in substrate topography also can give rise to resolution-limiting problems.

One approach used to reduce the problem of reflected radiation has been the use of a radiation absorbing layer interposed between the substrate surface and the photoresist coating layer. See U.S. Patent Publication 2005/0112494. Electronic device manufacturers continually seek increased resolution of a photoresist image patterned over antireflective coating layers and in turn demand ever-increasing performance from an antireflective composition.

It thus would be desirable to have new antireflective compositions for use with an overcoated photoresist.

We now provide new organic coating compositions that comprise a component that can be thermally treated to increase hydrophilicity, but without significant molecular gains (e.g. without extensive crosslinking) of components of the coating composition layer.

Thus, a coating composition of the invention can be formulated in one or more organic solvents such as used to formulate a photoresist composition; the coating composition applied to a substrate; the applied coating layer thermally treated to increase hydrophilicity of the layer; and a photoresist composition layer applied above the thermally treated layer. The increased hydrophilicity of the underlayer inhibits intermixing of that layer the overcoated resist layer. The photoresist layer then may be exposed to patterned activating radiation and developed such as with an aqueous alkaline developer composition. In preferred aspects, use of an aqueous alkaline developer composition can remove regions of the underlying coating composition that lie beneath developed photoresist regions.

In preferred aspects, the organic coating composition comprises a component that include one or more imide groups, such as one or more resins that comprise repeat units that contain imide groups. Preferred resins include copolymers, terpolymers, tetrapolymers or other higher order polymer where the resin comprises one or more distinct repeat units in addition to an imide moiety.

In particularly preferred aspects, the organic coating composition comprises a component that includes one or more modified imide groups, such as one or more resins that comprise repeat units that contains modified imide groups. Imide groups that have N-substitution with a thermally reactive (e.g. cleavable) moiety are especially preferred modified imide groups.

In particular, an N-substituted modified imide functionality can provide a deblocked imide group upon thermal treatment, i.e. thermal treatment can result in cleavage of the N-substituted moiety to provide the more hydrophilic unsubstituted imide (—N(C=O)$_2$H) group.

Alternatively, an N-substituted imide functionality can provide a hydrophilic group while retaining N-substitution of the imide group. Thus, for instance, an N-substituted imide group of the general formula —N(C=O)$_2$R can be thermally treated where the R group in that formula reacts to provide a more hydrophilic group of the general formula —N(C=O)$_2$R$^1$X where X is a hydrophilic group such as a carboxyl (COOH) or sulfonic acid moiety and R$^1$ is a linker such as a $C_{1-16}$alkylene e.g. —CH$_2$— or —CH$_2$CH$_2$—.

Imide groups may be modified with a variety of groups, such as ester groups (particularly tertiary esters that can be more thermally reactive) and acetal groups.

In preferred aspects of the invention, thermal treatment of the underlying coating composition does not induce significant molecular weight increases of composition component(s). For instance, one or more composition component components do not typically increase molecular weight more than 10, 20, 30, 40, 50 or 80 percent as a result of the thermal treatment. Thus, a crosslinking reaction (or at least significant crosslinking) is not a typical reaction induced by the thermal treatment in such preferred embodiments.

In such aspects of the invention, the underlying coating composition does not need to contain an additional crosslinker component (such as an amine material) as has been employed in prior underlying antireflective coating compositions. Thus, the underlying coating composition may be at least substantially, essentially or completely free of an added crosslinker component such as an amine material. An underlying coating composition will be at least substantially free of crosslinker if less than 5, 4, 3, 2 or 1 weight percent solids (all components except solvent carrier) are other than a crosslinker such as an amine-based material (e.g. benzoguanamine or melamine material).

An underlying coating composition of the invention optionally may comprise acid or an acid generator (e.g. photoacid-generator or thermal acid generator) to facilitate reaction during the thermal treatment step, e.g. to enable de-blocking of an N-substituted imide group at comparatively lower temperatures and/or shorter heating cycle times.

Preferred underlying compositions also may comprise one or more chromophore groups to thereby enhance functionality as antireflective layers for an overcoated photoresist layer. Preferred chromophore groups are aromatic groups such as phenyl groups for use with an overcoated photoresists imaged at 193 nm and anthracene and naphthylene groups for use with overcoated photoresists imaged at 248 nm.

In particular aspects, the underlying coating composition may comprise one or more resins that comprise repeat units that contain chromophore groups such as phenyl, anthracene and/or naphthyl. Groups that can provide enhanced hydrophilicity upon thermal treatment (such as N-substituted imide groups) can be present on the same component (e.g. resin) as such chromophore groups, or chromophore groups and thermally reactive groups such as N-substituted imide groups can be present on separate composition components such as separate (i.e. not covalently linked) resins.

One or more resins present in underlying coating compositions of the invention may comprise a variety of other repeat units, such as repeat units that comprise one or more of anhydride (e.g. maleic anhydride or itaconic anhydride), lactone (e.g. butyrolactone such as γ-butyrolactone), carbon alicyclic (e.g. adamantyl, norbornyl), acrylate groups, cyano groups, and hydroxyl groups, among others.

The invention also includes coated substrates, which may comprise a substrate having thereon (1) an organic coating composition as disclosed herein; and (2) a further composition layer above that organic composition. The overlying further composition may be e.g. a layer that comprises one or more organic component such as a photoresist composition, a hardmask composition, a lift-off layer, or other compositions. The substrate may be e.g. a microelectronic wafer substrate. Suitably, an organic or inorganic dielectric layer may be interposed between the substrate and the organic composition.

In a further aspect, the invention also includes a polymer which comprises repeat units that contain modified imide groups, such as modified maleimide or glutarimide groups, as disclosed herein.

The invention also include a such polymers that comprise repeat units that contain modified imide groups, wherein the polymer is solvated (at least significantly in solution) at room temperature (24° C.) in one or more organic solvents used to formulate photoresist compositions such as ethyl lactate and/or propylene glycol methyl ether acetate.

A variety of photoresists may be used in combination (i.e. overcoated) with a coating composition of the invention. Preferred photoresists for use with the underlying coating compositions of the invention are chemically-amplified resists, especially positive-acting photoresists that contain one or more photoacid generator compounds and a resin component that contains units that undergo a deblocking or cleavage reaction in the presence of photogenerated acid, such as photoacid-labile ester, acetal, ketal or ether units. Negative-acting photoresists also can be employed with coating compositions of the invention, such as resists that crosslink (i.e. cure or harden) upon exposure to activating radiation. Preferred photoresists for use with a coating composition of the invention may be imaged with relatively short-wavelength radiation, e.g. radiation having a wavelength of less than 300 nm or less than 260 nm such as about 248 nm, or radiation having a wavelength of less than about 200 nm, such as 193 nm.

As discussed above, in addition to or in place of a photoresist composition, other composition may be applied above a coating composition of the invention. For instance, a hardmask composition, a lift-off composition layer, a passivation layer, or other materials may be applied above a coating composition of the invention. Such overcoating layer(s) suitable comprise one or more organic components (e.g. organic resin), but inorganic layers also may be applied above a coating composition of the invention. Additionally, such overcoating layers may be suitably photoimageable (such as a photoresist) or non-photoimageable.

Other aspects of the invention are disclosed infra.

Figure 1B:
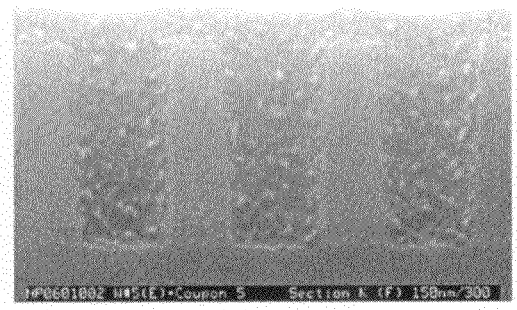
Figure 1C:
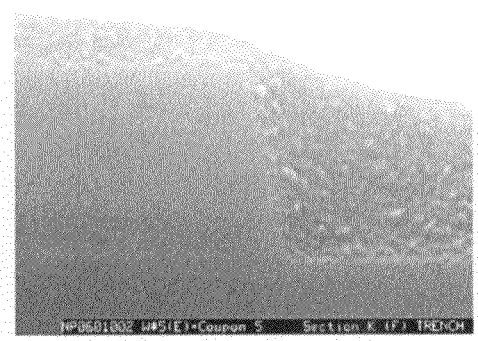

FIGS. 1A, 1B and 1C show results of Example 4, which follows.

COATING COMPOSITIONS

As discussed above, we now provide new coating compositions that are advantageously used with an overcoated photoresist composition layer.

Particularly preferred compositions of the invention comprise one or more resins that comprise repeat units with imide moieties. We have found that use of modified imide groups (e.g. N-substituted imide groups such as groups of the formula —C(=O)NRC(=O)— where N is other than hydrogen particularly an organic group with one or more hetero (N, O or S) atoms) can render resins soluble in common photoresist and edge bead removal solvents (e.g., ethyl lactate, propylene glycol methyl ether acetate (PGMEA), cyclohexanone) and can be spin coated to give thin films with good planarity. Upon a short thermal treatment, with or without the presence of acid, preferred imide-modifying moieties can undergo a de-blocking reaction that renders the imide-resins comparatively insoluble to the solvent(s) that the coating composition were originally cast from. Particularly preferred thermally treated imide polymers of the invention are base soluble and can be readily removed with standard aqueous alkaline developer, such as a 0.26N aqueous tetramethyl ammonium hydroxide developer.

Thus, particularly preferred coating compositions of the invention can be formulated in photoresist solvent(s) (i.e. the composition components are soluble in such solvent(s)).

As discussed above, in preferred coating compositions of the invention, thermal treatment of a coating layer of the composition can render the coating layer comparatively insoluble in photoresist solvents and thus a photoresist layer can be coated thereon with minimal intermixing of the layers.

Also, as discussed above, in preferred coating composition thermal treated composition layers can be removed with aqueous alkaline developer composition. Thus, in preferred aspects, the underlaying coating composition is rendered sufficiently hydrophilic after the thermal treatment so that the coating layer has reasonable solubility in aqueous alkaline developer used to develop the overcoated resist layer, thereby enabling development of both the resist and underlying composition layer in a single development step.

The following exemplary Scheme 1 depicts a suitable system of the invention, where a resin containing the depicted dimethylglutarimide group is N-substituted with a methylene t-butyl ester group. Other N-substitution can be readily made. The N-substitution renders the resin more hydrophobic and thus soluble in organic solvents typically used for photoresist formulation such as ethyl lactate and/or propylene glycol methyl ether acetate. An underlying coating composition then can be thermally treated to produce a more hydrophilic group such as the carboxy moiety depicted in the Scheme 1 below. That increased hydrophilicity will inhibit intermixing of the coating composition with an overcoated photoresist composition layer, but render the layer soluble in an aqueous alkaline developer.

Scheme 1

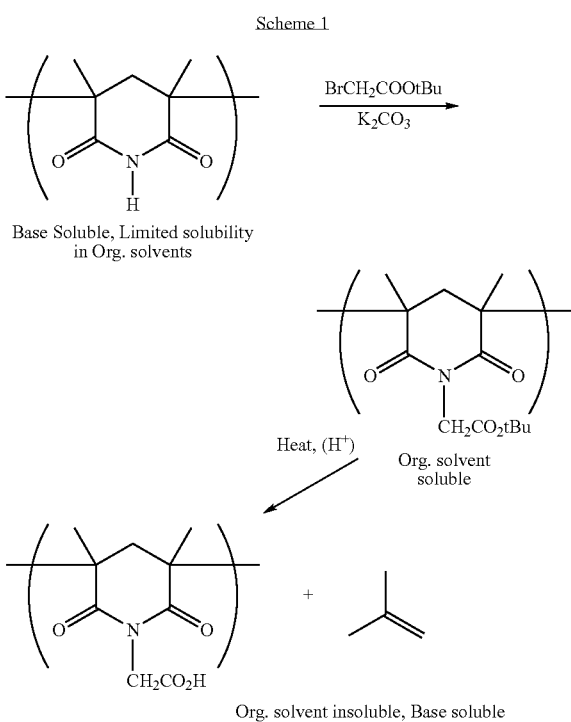

Scheme 2 below shows a further imide modification in accordance with the invention where an imide (polyglutarimide shown) is reacted with di-tert-butyl dicarbonate under basic conditions to provide the carbamate group depicted above. The carbamate polymer can be soluble in typical photoresist solvents such as ethyl lactate and/or propylene glycol methyl ether acetate. An underlying coating composition that contains the polymer then can be thermally treated to produce a more hydrophilic group such as the imide moiety depicted in the below Scheme 2. That increased hydrophilicity will inhibit intermixing of the coating composition with an overcoated photoresist composition layer, but render the layer soluble in an aqueous alkaline developer.

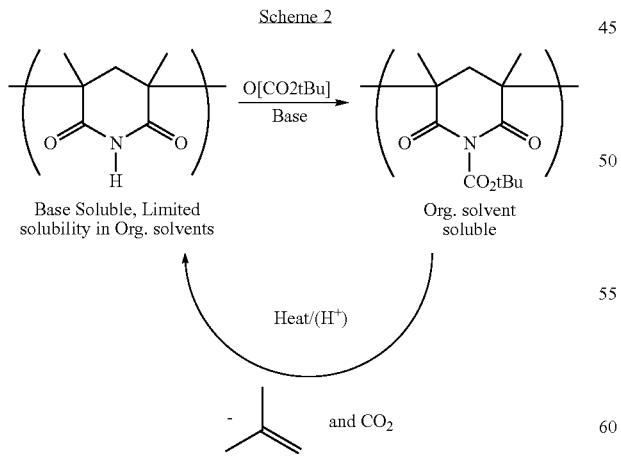

Preferred underlying composition layers of the invention can exhibit notable planarization properties including via and gap fill without voids.

Preferred underlying coating composition layers of the invention also can exhibit high modulus, high glass transition temperature (e.g. >150° C.), high thermal stability (e.g., >300° C.) and/or low outgassing of composition components.

Preferred underlying coating compositions of the invention also can exhibit low defect counts of a substrate (e.g. microelectronic wafer) processed with the coating composition.

Preferred underlying coating compositions of the invention also can exhibit large selectivity differential between oxide and reductive etch.

Specifically preferred underlying coating compositions of the invention include resins that contain glutarimide particularly dimethylglutarimide groups and/or polymerized maleimide groups. Preferred resins include copolymers, terpolymers, tetrapolymers or other higher order polymer where the resin comprises one or more distinct repeat units in addition to an imide moiety. Thus, for instance, in one preferred system, a coating composition comprises a polymer comprises dimethylglutarimide and/or polymerized maleimide repeat units in addition to acrylate groups such as methyl methacrylate and/or methacrylic acid units.

For instance, in certain aspects, suitable resins may comprise units of the following formulae (I), (II), (III) and (IV):

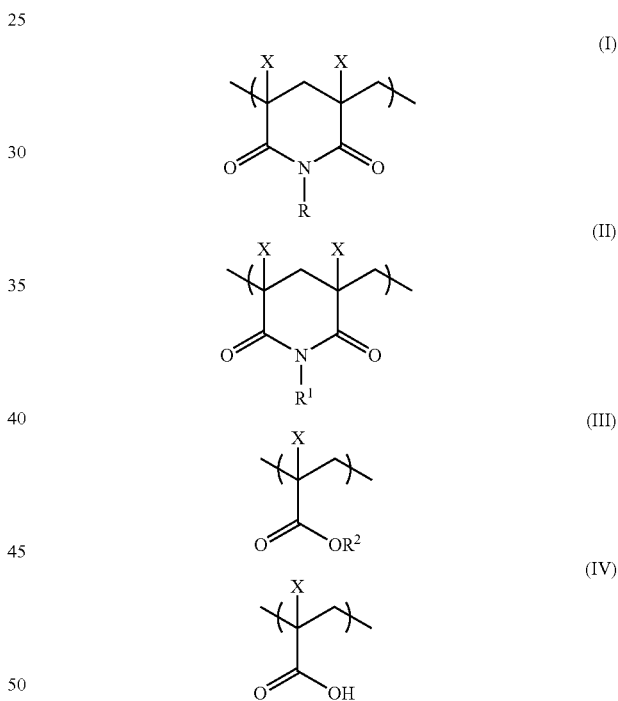

wherein in those Formulae (I), (II), (III) and (IV):

each X is independently hydrogen or $C_{1-6}$alkyl such as methyl and preferably X moieties of glutarimide moieties are methyl;

R and $R^1$ are each independently hydrogen or a non-hydrogen substituent such as a chromophore group (e.g. an aromatic group such as phenyl, naphthyl or anthracene), $C_{1-20}$alkyl, ester such as a group of the formula —$(CH_2)_n$C(=O)OY where n is an integer of 0 to 15 and Y is a $C_{1-20}$ alkyl group and preferably Y is a group such as tert-butyl to provide a tertiary ester, or other groups such as a chromophore group (e.g. an aromatic group such as phenyl, naphthyl or anthracene), and at least one of R and $R^1$ is other than hydrogen and preferably at least one of R and $R^1$ is a thermally reactive group such as ester or acetal that can undergo reaction during thermal treatment of a coating layer containing the resin to provide a more hydrophilic group; and $R^2$ is hydrogen or a non-hydrogen substituent such as $C_{1-20}$alkyl.

In certain preferred resins, a resin will have at least one group of Formulae (I) or (II) above where at least of R and $R^1$ is other than hydrogen and preferably is a thermally reactive group such as ester or acetal. Suitably, a resin will have from about 4 to about 80 or 90 or more weight percent of units of Formulae (I) and (II), based on total units of the polymer. A resin may suitably not contain groups of Formulae (III) and/or ((IV), although good results have been obtained with resins having such groups.

As mentioned above, preferred underlying coating compositions also may contain one or more resins that contain polymerized maleimide such as repeat units that comprise a structure of the following formula (V):

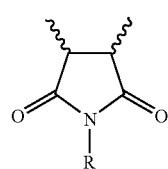

(V)

where in that formula (V) R is hydrogen or a non-hydrogen substituent such as $C_{1-20}$alkyl, ester such as a group of the formula —$(CH_2)_nC(=O)OY$ where n is an integer of 0 to 15 and Y is a $C_{1-20}$ alkyl group and preferably Y is a group such as tert-butyl to provide a tertiary ester, and at least one of R and $R^1$ is other than hydrogen and preferably the resin comprises maleimide groups of the above formulae where R is a non-hydrogen substituent particularly a thermally reactive group such as ester or acetal that can undergo reaction during thermal treatment of a coating layer containing the resin to provide a more hydrophilic group. In the formula (v), the wavy lines indicates resin backbone linkages.

As discussed above, generally preferred are resins that comprise additional repeat units distinct from repeat units that contain malemide groups.

Coating compositions of the invention, particularly for reflection control applications, also may contain additional dye compounds that absorb radiation used to expose an overcoated photoresist layer. Other optional additives include surface leveling agents, for example, the leveling agent available under the tradename Silwet 7604 from General Electric, or the surfactant PC 171 or FC 431 available from the 3M Company.

Resins useful in underlying coating compositions of the invention can be readily synthesized by known procedures, such as polymerization (e.g. in the presence of a radical initiator) of one or more acrylate monomers such as e.g. maleimide, glutarimide, styrene, t-butylacrylate, t-butylmethacrylate, methylmethacrylate, butyl methacrylatemethylanthracene methacrylate or other anthracene acrylate and the like. Other monomers including anhydrides such as maleic anhydride can be co-polymerized with acrylate monomers. For use in antireflective compositions, one or more co-polymerized monomers can contain suitable chromophore groups, such as anthracene for use in antireflective coating compositions utilized with an overcoated photoresist imaged with 248 nm radiation, or phenyl for use in an antireflective coating composition imaged with 193 nm radiation. See also the examples which follow for suitable syntheses of resins useful in coating compositions of the invention. Suitable polyglutarimide syntheses are also disclosed in U.S. Pat. Nos. 4,246,374 and 5,004,777.

Thermal reactive groups may be incorporated into a resin by a variety of approaches including grafting such groups onto a formed resin as discussed above with respect to the Scheme, or including such groups in a monomer or oligomer that is polymerized with other materials to form a resin. For example, thermally-reactive esters and acetal moieties may be suitably grafted onto the nitrogen of imide group of a formed resin. For instance, an ester grafted onto a imide nitrogen group is a preferred thermally reactive group (upon thermal treatment, de-esterification to provide aqueous alkaline developer-solubilizing carboxy group, or the ester group cleaves to provide the aqueous alkaline developer-solubilizing unsubstituted imide group). Such esters may be provided e.g. by reaction of a haloacetate compound (e.g. tert-butyl chloroacetate or t-butyl bromoacetate) with a imide nitrogen group.

Acetal groups also are preferred thermally-reactive groups; for example a vinyl ether compound may be grafted onto an imide nitrogen to provide a thermally reactive acetal group. Suitable vinyl ether reagents to provide a thermally reactive acetal group include compounds having at least one —(CH=CH)—O— group such as ethylvinyl ether and the like.

Preferred thermally-reactive esters include the above-discussed t-butyl esters as well as other tertiary esters such as dimethyl benzyl i.e. —$C(CH_3)_2C_6H_5$. Tertiary esters (i.e. groups of the formula —$C(=O)OCRR^1R^2$ where R, $R^1$ and $R^2$ are each non-hydrogen substituents) can be more thermally reactive and thus undergo reaction at lower temperatures and/or shorter thermal treatment times. Nevertheless, other esters also may be employed as a benzyl esters and secondary esters such as a sec-butyl ester or an iso-propyl ester.

In certain aspects, preferred underlying coating compositions of the invention may comprise one or more components that comprise anhydride and hydroxyl moieties. In such preferred compositions, anhydride and hydroxyl moieties may be present together on a single composition component such as a resin, e.g. by copolymerizing monomers that contain hydroxyl groups with anhydride monomers. Alternatively, anhydride and hydroxyl moieties may be present together on a distinct composition component such as distinct resins, e.g. where one resin comprises anhydride groups and a distinct resin comprises hydroxyl groups.

As discussed above, for antireflective applications, suitably one or more of the compounds reacted to form the resin comprise a moiety that can function as a chromophore to absorb radiation employed to expose an overcoated photoresist coating layer. Additionally, a chromophore group (such as an aromatic e.g. phenyl, naphthyl or anthracene) may be grafted onto an imide nitrogen.

For example, a phenyl compound such as styrene or a phenyl acrylate (e.g. benzyl acrylate or benzyl methacrylate) may be polymerized with other monomers to provide a resin particularly useful in an antireflective composition employed with a photoresist imaged at sub-200 nm wavelengths such as 193 nm. Similarly, resins to be used in compositions with an overcoated photoresist imaged at sub-300 nm wavelengths or sub-200 nm wavelengths such as 248 nm or 193 nm, a naphthyl compound may be polymerized, such as a naphthyl compound containing one or two or more carboxyl substituents e.g. dialkyl particularly di-$C_{1-6}$alkyl naphthalenedicarboxylate. Reactive anthracene compounds also are preferred, e.g.

an anthracene compound having one or more carboxy or ester groups, such as one or more methyl ester or ethyl ester groups.

For deep UV applications (i.e. the overcoated resist is imaged with deep UV radiation), a polymer of an antireflective composition preferably will absorb reflections in the deep UV range (typically from about 100 to 300 nm). Thus, the polymer preferably contains units that are deep UV chromophores, i.e. units that absorb deep UV radiation. Highly conjugated moieties are generally suitable chromophores. Aromatic groups, particularly polycyclic hydrocarbon or heterocyclic units, are typically preferred deep UV chromophore, e.g. groups having from two to three to four fused or separate rings with 3 to 8 members in each ring and zero to three N, O or S atoms per ring. Such chromophores include optionally substituted phenanthryl, optionally substituted anthracyl, optionally substituted acridine, optionally substituted naphthyl, optionally substituted quinolinyl and ring-substituted quinolinyls such as hydroxyquinolinyl groups. Optionally substituted anthracenyl groups are particularly preferred for 248 nm imaging of an overcoated resist. Preferred antireflective composition resins have pendant anthracene groups. Preferred resins include those of Formula I as disclosed on page 4 of European Published Application 813114A2 of the Shipley Company.

Another preferred resin binder comprises optionally substituted quinolinyl groups or a quinolinyl derivative that has one or more N, O or S ring atoms such as a hydroxyquinolinyl. The polymer may contain other units such as carboxy and/or alkyl ester units pendant from the polymer backbone. A particularly preferred antireflective composition resin in an acrylic containing such units, such as resins of formula II disclosed on pages 4-5 of European Published Application 813114A2 of the Shipley Company.

As discussed above, for imaging at 193 nm, the antireflective composition preferably may contain a resin that has phenyl chromophore units. For instance, one suitable antireflective resin for use with photoresists imaged at 193 nm is a terpolymer consisting of polymerized units of styrene, maleic anhydride, and 2-hydroxyethyl methacrylate.

Preferably resins of underlying coating compositions of the invention will have a weight average molecular weight (Mw) of about 1,000 to about 10,000,000 daltons, more typically about 5,000 to about 1,000,000 daltons, and a number average molecular weight (Mn) of about 500 to about 1,000,000 daltons. In certain aspects, preferred resins of underlying coating compositions may have a weight average molecular weight of about 2,000 to 100,000, more typically from about 5,000 or 10,000 to 50,0000. Molecular weights (either Mw or Mn) of the polymers of the invention are suitably determined by gel permeation chromatography.

While coating composition resins having absorbing chromophores are generally preferred, antireflective compositions of the invention may comprise other resins either as a co-resin or as the sole resin binder component. For example, phenolics, e.g. poly(vinylphenols) and novolaks, may be employed. Such resins are disclosed in the incorporated European Application EP 542008 of the Shipley Company. Other resins described below as photoresist resin binders also could be employed in resin binder components of antireflective compositions of the invention.

The concentration of such a resin component of the coating compositions of the invention may vary within relatively broad ranges, and in general the resin binder is employed in a concentration of from about 50 to 95 weight percent of the total of the dry components of the coating composition, more typically from about 60 to 90 weight percent of the total dry components (all components except solvent carrier).

Acid or Acid Generator Compound

Optional Component

Coating compositions of the invention may comprise additional optional components. Thus, for example, a coating composition may suitably comprise an added acid source such as an acid or acid generator compound particularly a thermal acid generator compound. The added acid can facilitate the thermally promoted reaction during the thermal treatment step, thereby enabling the reaction to increase hydrophilicity of the underlying composition layer to proceed at lower temperatures and shorter times.

However, as discussed above, in preferred aspects, underlying coating compositions of the invention may be formulated without such an added acid or acid generator compound(s). Such compositions free or at least essentially free of any added acid or acid generator compounds may provide performance benefits, including enhanced shelf life and reduced defects. As referred to herein a composition that is essentially free of added acid or acid generator compounds has less than 3, 2 or 1 weight percent of added acid or acid generator compounds based on total weight of the formulated solvent-based coating composition. As also referred to herein, an added acid is distinct from residual acid that may be present in a composition, such as residual acid entrapped in a resin remaining from the resin synthesis.

If an added acid or acid generator compound are employed, a coating composition suitably comprises a thermal acid generator compound (i.e. compound that generates acid upon thermal treatment), such as an ionic or substantially neutral thermal acid generator, e.g. an ammonium arenesulfonate salt, for catalyzing or promoting crosslinking during curing of an antireflective composition coating layer. Typically one or more thermal acid generators are present in an antireflective composition in a concentration from about 0.1 to 10 percent by weight of the total of the dry components of the composition (all components except solvent carrier), more preferably about 2 percent by weight of the total dry components.

Coating compositions of the invention also may contain one or more photoacid generator compounds typically in addition to another acid source such as an acid or thermal acid generator compound. Use of such photoacid generator component is not to render the composition photoimageable, but rather to enhance resolution of images formed in an overcoated photoresist layer. Thus, a photoacid generator in the underlying coating composition will not be activated (i.e. photoacid generated) until exposure of the overcoated photoresist layer.

Generally preferred photoacid generators for such use in underlying compositions of the invention include e.g. onium salts such as di(4-tert-butylphenyl)iodonium perfluoroctane sulphonate, halogenated non-ionic photoacid generators such as 1,1-bis[p-chlorophenyl]-2,2,2-trichloroethane, and other photoacid generators disclosed for use in photoresist compositions.

Formulation of an Underlying Coating Composition

To make a liquid coating composition of the invention, the components of the underlying coating composition are dissolved in one or more suitable solvents such as, for example, one or more oxyisobutyric acid esters particularly methyl-2-hydroxyisobutyrate as discussed above, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. A preferred solvent for an antireflective coating composition of the invention is methyl-2-hydroxyisobutyrate, optionally blended with anisole. The concentration of the dry components in the solvent will depend on several factors such as the method of application. In general, the solids content of an antireflective composition varies from about 0.5 to 20 weight percent of the total weight of the coating composition, preferably the solids content varies from about 2 to 10 weight of the coating composition.

Resins and Organic Solutions/Solvates of Resins

As discussed above, in a further aspect, the invention also includes polymers which comprises repeat units that contain modified imide groups, such as modified maleimide or glutarimide groups, as disclosed herein.

Suitable resins of the invention that contain imide functionalities are described herein.

In certain preferred aspects, a polyglutarimide is provided where the resin is a substantial homopolymer (e.g. where at least 85, 90, 95, 98 or 99 percent of total repeat units are glutarimide units or modified glutarimide units), where a portion (e.g. at least 0.5, 1, 5, 10, 20, 30, 40, 50, 60, 70, 80, or 90 percent of total glutarimide repeat units) have N-substitution modification, e.g. where the glutarimide nitrogen is substituted with an ester or acetal group.

In additional preferred aspects, a polymaleimide, which suitably may be a copolymer or other higher order polymer (i.e. the polymer may suitably comprise repeat units other than maleimide), where a portion (e.g. at least 0.5, 1, 5, 10, 20, 30, 40, 50, 60, 70, 80, or 90 percent of total maleimide repeat units) have N-substitution modification, e.g. where the maleimide nitrogen is substituted with an ester or acetal group.

The invention also include a such polymers that comprise repeat units that contain modified imide groups, wherein the polymer is solvated (at least significantly in solution at 10 percent total solids composition) at room temperature (24° C.) in one or more organic solvents used to formulate photoresist compositions such as ethyl lactate and/or propylene glycol methyl ether acetate. Solvation is assessed by naked eye inspection, i.e. no visible particulate matter from the polymer in the 10 percent solids solution.

Exemplary Overcoating Composition Layers

As discussed above, a further overlying composition may be used with a coating composition of the invention such as in the manufacture of a semiconductor or other microelectronic device. A wide variety of composition may be overcoated including e.g. a photoresist composition, a hardmask composition, a lift-off layer, a passivation layer, or other composition layer.

A variety of photoresist compositions can be employed with coating compositions of the invention, including positive-acting and negative-acting photoacid-generating compositions. Photoresists used with underlying compositions of the invention typically comprise a resin binder and a photoactive component, typically a photoacid generator compound. Preferably the photoresist resin binder has functional groups that impart alkaline aqueous developability to the imaged resist composition.

Particularly preferred photoresists for use with underlying compositions of the invention are chemically-amplified resists, particularly positive-acting chemically-amplified resist compositions, where the photoactivated acid in the resist layer induces a deprotection-type reaction of one or more composition components to thereby provide solubility differentials between exposed and unexposed regions of the resist coating layer. A number of chemically-amplified resist compositions have been described, e.g., in U.S. Pat. Nos. 4,968,581; 4,883,740; 4,810,613; 4,491,628 and 5,492,793, all of which are incorporated herein by reference for their teaching of making and using chemically amplified positive-acting resists. Coating compositions of the invention are particularly suitably used with positive chemically-amplified photoresists that have acetal groups that undergo deblocking in the presence of a photoacid. Such acetal-based resists have been described in e.g. U.S. Pat. Nos. 5,929,176 and 6,090, 526.

The underlying compositions of the invention also may be used with other positive resists, including those that contain resin binders that comprise polar functional groups such as hydroxyl or carboxylate and the resin binder is used in a resist composition in an amount sufficient to render the resist developable with an aqueous alkaline solution. Generally preferred resist resin binders are phenolic resins including phenol aldehyde condensates known in the art as novolak resins, homo and copolymers or alkenyl phenols and homo and copolymers of N-hydroxyphenyl-maleimides.

Preferred positive-acting photoresists for use with an underlying coating composition of the invention contains an imaging-effective amount of photoacid generator compounds and one or more resins that are selected from the group of:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates that can undergo a photoacid-induced reaction, such as polymers in U.S. Pat. Nos. 6,042,997 and 5,492,793; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042,997, incorporated herein by reference; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526.

2) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624, and 6,048, 664; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057,083; European Published Applications EP01008913A1 and EP00930542A1; and U.S. pending patent application Ser. No. 09/143,462, and iii) polymers that contain polymerized anhydride units, particularly polymerized maleic anhydride and/or itaconic anhydride units, such as disclosed in European Published Application EP01008913A1 and U.S. Pat. No. 6,048,662.

3) a resin that contains repeat units that contain a hetero atom, particularly oxygen and/or sulfur (but other than an anhydride, i.e. the unit does not contain a keto ring atom), and preferable are substantially or completely free of any aromatic units. Preferably, the heteroalicyclic unit is fused to the resin backbone, and further preferred is where the resin comprises a fused carbon alicyclic unit such as provided by polymerization of a norborene group and/or an anhydride unit such as provided by polymerization of a maleic anhydride or itaconic anhydride. Such resins are disclosed in PCT/US01/14914.

4) a resin that contains fluorine substitution (fluoropolymer), e.g. as may be provided by polymerization of tetrafluoroethylene, a fluorinated aromatic group such as fluoro-styrene compound, and the like. Examples of such resins are disclosed e.g. in PCT/US99/21912.

Suitable photoacid generators to employ in a positive or negative acting photoresist overcoated over a coating composition of the invention include imidosulfonates such as compounds of the following formula:

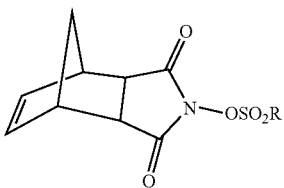

wherein R is camphor, adamantane, alkyl (e.g. $C_{1-12}$ alkyl) and perfluoroalkyl such as perfluoro($C_{1-12}$alkyl), particularly perfluorooctanesulfonate, perfluorononanesulfonate and the like. A specifically preferred PAG is N-[(perfluorooctanesulfonyl)oxy]-5-norbornene-2,3-dicarboximide.

Sulfonate compounds are also suitable PAGs for resists overcoated a coating composition of the invention, particularly sulfonate salts. Two suitable agents for 193 nm and 248 nm imaging are the following PAGS 1 and 2:

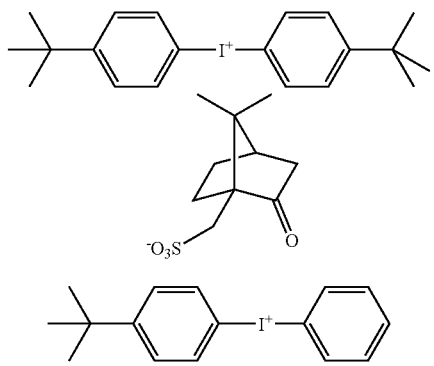

-continued

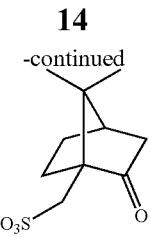

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3$— where R is adamantane, alkyl (e.g. $C_{1-12}$ alkyl) and perfluoroalkyl such as perfluoro ($C_{1-12}$alkyl), particularly perfluorooctanesulfonate, perfluorobutanesulfonate and the like.

Other known PAGS also may be employed in photoresist used with underlying coating compositions.

A preferred optional additive of photoresists overcoated a coating composition of the invention is an added base, particularly tetrabutylammonium hydroxide (TBAH), or tetrabutylammonium lactate, which can enhance resolution of a developed resist relief image. For resists imaged at 193 nm, a preferred added base is a hindered amine such as diazabicyclo undecene or diazabicyclononene. The added base is suitably used in relatively small amounts, e.g. about 0.03 to 5 percent by weight relative to the total solids.

Preferred negative-acting resist compositions for use with an overcoated coating composition of the invention comprise a mixture of materials that will cure, crosslink or harden upon exposure to acid, and a photoacid generator.

Particularly preferred negative-acting resist compositions comprise a resin binder such as a phenolic resin, a crosslinker component and a photoactive component of the invention. Such compositions and the use thereof have been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by Cytec Industries under the trade names Cymel 300, 301 and 303. Glycoluril resins are sold by Cytec Industries under trade names Cymel 1170, 1171, 1172, Powderlink 1174, and benzoguanamine resins are sold under the trade names of Cymel 1123 and 1125.

Suitable photoacid generator compounds of resists used with underlying compositions of the invention include the onium salts, such as those disclosed in U.S. Pat. Nos. 4,442,197, 4,603,101, and 4,624,912, each incorporated herein by reference; and non-ionic organic photoactive compounds such as the halogenated photoactive compounds as in U.S. Pat. No. 5,128,232 to Thackeray et al. and sulfonate photoacid generators including sulfonated esters and sulfonlyoxy ketones. See J. of Photopolymer Science and Technology, 4(3):337-340 (1991), for disclosure of suitable sulfonate PAGS, including benzoin tosylate, t-butylphenyl alpha-(p-toluenesulfonyloxy)-acetate and t-butyl alpha(p-toluene-sulfonyloxy)-acetate. Preferred sulfonate PAGs are also disclosed in U.S. Pat. No. 5,344,742 to Sinta et al. The above camphorsulfoanate PAGs 1 and 2 are also preferred photoacid generators for resist compositions used with the underlying compositions of the invention, particularly chemically-amplified resists of the invention.

Photoresists for use with an underlying composition of the invention also may contain other materials. For example, other optional additives include actinic and contrast dyes, anti-striation agents, plasticizers, speed enhancers, etc. Such optional additives typically will be present in minor concentration in a photoresist composition except for fillers and dyes which may be present in relatively large concentrations such as, e.g., in amounts of from about 5 to 50 percent by weight of the total weight of a resist's dry components.

As discussed, other compositions may be applied above a coating composition of the invention. For instance, a hardmask composition may be applied above a coating composition. Suitable hardmask composition may comprise an organic resin with silicon content. Exemplary hard mask composition are described in U.S. Pat. No. 7,017,817 to Pavelchek et al. Preferred hardmask compositions may comprise a mixture of distinct resins, wherein the mixture includes at least one resin that has silicon content and at least one resin distinct from the Si-resin that has chromophore groups that can effectively absorb radiation employed to expose an overcoated photoresist layer. By stating that a resin is distinct from an Si-resin, the differences will include the chemical composition of the resin with respect to the Si-resin and the differences will not be limited solely to molecular weight. For instance, a distinct resin may not have any Si-content. In a particular preferred aspect, a hardmask composition may comprise a resin with high Si content which is mixed with an organic resin that comprises exposure radiation-absorbing chromophores. Chromophore groups are typically aromatic groups such as optionally substituted phenyl, optionally substituted naphthyl or optionally substituted anthracenyl.

Suitable hard mask compositions such as a silicon oxide also may be chemical vapor deposited (CVD) above an underlying coating composition of the invention.

Suitable lift-off layers are disclosed in U.S. Pat. No. 7,056,824 to Mirth. An underlying coating composition of the invention also could be employed as a lift-off layer. After being disposed on the substrate, the lift-off layer coating composition is heated to remove any solvent (i.e. soft baked) and to provide a lift-off-layer on the substrate. One or more polymeric coatings, such as a photoresist or antireflective coating composition, are then typically disposed on the lift-off-layer by any conventional means. Typically, such polymeric coating is disposed on the lift-off-layer by spin coating. The polymeric coating composition is then heated to remove solvent. When the polymeric composition is an antireflective coating composition, it is next cured (cross-linked) prior to the disposition of any photoresist on the antireflective coating. Such curing step may be performed by any suitable means, such as heating, irradiation or a combination of heating and irradiation. In one embodiment, one or more layers of a photoresist composition are disposed on the lift-off-layer. In another embodiment, one or more layers of an antireflective coating are disposed on the lift-off-layer and then one or more layers of a photoresist are then disposed on the antireflective coating layer(s).

Lithographic Processing of Underlying Coating Compositions that are Thermally Deprotectable In use, a coating composition of the invention is applied as a coating layer to a substrate by any of a variety of methods such as spin coating. The coating composition in general is applied on a substrate with a dried layer thickness of between about 0.02 and 0.5 μm, preferably a dried layer thickness of between about 0.04 and 0.20 μm. The substrate is suitably any substrate used in processes involving photoresists. For example, the substrate can be silicon, silicon dioxide or aluminum-aluminum oxide microelectronic wafers. Gallium arsenide, silicon carbide, ceramic, quartz or copper substrates may also be employed. Substrates for liquid crystal display or other flat panel display applications are also suitably employed, for example glass substrates, indium tin oxide coated substrates and the like. Substrates for optical and optical-electronic devices (e.g. waveguides) also can be employed.

As discussed above, preferably the applied coating layer is thermally treated before a photoresist composition is applied over the antireflective composition. Cure conditions will vary with the components of the coating composition. Typical thermal treatment conditions may be suitably from about 150° C. to 250° C. for about 0.5 to 5 minutes. Thermal treatment conditions preferably render the coating composition coating layer substantially insoluble or non-mixable with photoresist solvent, but soluble in alkaline aqueous developer solution.

After such thermal treatment, a further coating composition may be applied above the coating composition layer.

For example, a photoresist composition may be applied above the surface of the top coating composition. As with application of the bottom coating composition layer(s), the overcoated photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the underlying composition layer and overcoated photoresist layer should occur.

The resist layer is then imaged with activating radiation through a mask in a conventional manner. The exposure energy is sufficient to effectively activate the photoactive component of the resist system to produce a patterned image in the resist coating layer. Typically, the exposure energy ranges from about 3 to 300 mJ/cm$^2$ and depending in part upon the exposure tool and the particular resist and resist processing that is employed. The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to about 160° C.

The photoresist layer also may be exposed in an immersion lithography system, i.e. where the space between the exposure tool (particularly the projection lens) and the photoresist coated substrate is occupied by an immersion fluid, such as water or water mixed with one or more additives such as cesium sulfate which can provide a fluid of enhanced refractive index. Preferably the immersion fluid (e.g., water) has been treated to avoid bubbles, e.g. water can be degassed to avoid nanobubbles.

References herein to "immersion exposing" or other similar term indicates that exposure is conducted with such a fluid layer (e.g. water or water with additives) interposed between an exposure tool and the coated photoresist composition layer.

The exposed resist coating layer is then developed, preferably with an aqueous based developer such as an alkali exemplified by tetramethyl ammonium hydroxide, sodium hydroxide, potassium hydroxide, sodium carbonate, sodium bicarbonate, sodium silicate, sodium metasilicate, aqueous ammonia or the like. Alternatively, organic developers can be used. In general, development is in accordance with art recognized procedures. Following development, a final bake of an acid-hardening photoresist is often employed at temperatures of from about 100° C. to about 150° C. for several minutes to further cure the developed exposed coating layer areas.

As discussed above, in preferred systems, development of the photoresist layer with aqueous alkaline developer also can remove underlying coating composition regions that underlie the developer-removed photoresist areas.

The developed substrate may then be selectively processed on those substrate areas bared of photoresist, for example, chemically etching or plating substrate areas bared of photoresist in accordance with procedures well known in the art. Suitable etchants include a hydrofluoric acid etching solution and a plasma gas etch such as an oxygen plasma etch.

The following non-limiting examples are illustrative of the invention.

EXAMPLE 1

Synthesis of Modified Polyglutarimide

To 15.3 g polyglutamide (Mw of 19,096 with a polydispersity of 1.7 and a percent nitrogen content of about 9%) dissolved in 155 g of N,N-dimethyl formamide was added with stirring anhydrous potassium carbonate (9.0 g). The mixture was stirred at 21° C. for 30 minutes. t-Butyl bromoacetate (20.0 g) was slowly added to the mixture followed by heating at 75° for 18 hours. After cooling the salts were removed by filtration and washed with a small portions of N,N-dimethylformamide. The combined filtrate was slowly precipitated into 1.0 L of de-mineralized water acidified with 50 mL of 0.1N hydrochloric acid. The precipitated product was collected on a filter and washed with about 200 mL of di-mineralized water. After a partial drying on the filter the polymer was slurried in two 200 mL portions of methanol. The product was partially dried on the filter and further dried at 50° C. under vacuum to give about 19.8 g of modified polymer. GPC analysis revealed that the obtained polymer had a weight average molecular weight (Mw) of about 26 k and a polydispersity (Mw/Mn) of 1.61.

EXAMPLE 2

To 15.3 g polyglutamide (Mw of 19,096 with a polydispersity of 1.7 and a percent nitrogen content of about 9%) dissolved in 155 g of N,N-dimethyl formamide is added with stirring triethylamine (0.05 g). The mixture was stirred at 21° C. for 30 minutes. Di-tert-butyl dicarbonate (22.0 g) was slowly added to the mixture at 25° and stirred for 18 hours. The solution was slowly precipitated into 1.0 L of de-mineralized water. The precipitated product was collected on a filter and washed with about 200 mL of di-mineralized water. After a partial drying on the filter the polymer was slurried in two 200 mL portions of methanol. The product was partially dried on the filter and further dried at 50° C. under vacuum to give about 18.4 g of modified polymer.

EXAMPLE 3

To 15.3 g polyglutamide (Mw of 19,096 with a polydispersity of 1.7 and a percent nitrogen content of about 9%) dissolved in 155 g of N,N-dimethyl formamide was added with stirring anhydrous potassium carbonate (9.0 g). The mixture was stirred at 21° C. for 30 minutes. Benzylbromide (3.4 g) was slowly added to the mixture followed by stirring for 4 hours at 21° C. t-Butyl bromoacetate (20.0 g) was slowly added to the mixture followed by heating at 75° for 18 hours. After cooling the salts were removed by filtration and washed with a small portions of N,N-dimethylformamide. The combined filtrate was slowly precipitated into 1.0 L of de-mineralized water acidified with 50 mL of 0.1N hydrochloric acid. The precipitated product was collected on a filter and washed with about 200 mL of di-mineralized water. After a partial drying on the filter the polymer was slurried in two 200 mL portions of methanol. The product was partially dried on the filter and further dried at 50° C. under vacuum to give about 20.0 g of modified polymer.

EXAMPLE 4

A solution of the polyglatarimide polyglutamide (Mw of 19,096 with a polydispersity of 1.7 and a percent nitrogen content of about 9%) dissolved in N,N-dimethyl formamide is reacted with di-tert-butyl dicarbonate in the presence of triethylamine and dimethylaminopyridine to give the tert-butyl carbamates derivative shown in Scheme 2 above.

EXAMPLES 5-24

Additional samples are prepared using the procedures identified in Example 1 with the substituents shown in Table 1 below. In Table 1 below, the "R" substituent replaces as appropriate the alkyl(tert-butyl) substituent of the modified imide polymer of Example 1 above. Those differing R substituents can be provided by use of corresponding bromoacetate reagents as set forth in Example 1 above.

TABLE 1

| Substituent | |
|---|---|
| Example | R |
| 5 | iso butyl |
| 6 | iso propyl |
| 7 | ethyl |
| 8 | methyl |
| 9 | tert. amyl |
| 10 | 1-ethyl cyclopentyl |
| 11 | isobornyl |
| 12 | phenyl |
| 13 | benzyl |
| 14 | 1-methylbenzyl |
| 15 | 1,1 dimethyl benzyl |
| 16 | 2-phenylethyl |
| 17 | 1-adamantyl |
| 18 | 2-methylenefuranyl |
| 19 | 9-methylenefluorenene |
| 20 | 2-napthylene |
| 21 | 9-methyleneanthracene |
| 22 | 1-diamantane |
| 23 | 1-cyclohexyl |
| 24 | 1-cyclopentyl |

EXAMPLES 25-45

Polymers derivatives are also prepared containing alkyl, alkyl ester and carbamate derivatives within the same polymer chain. Table 2 provides examples of some of the derivatives prepared. In Table 2, listed are (1) the percent alkyl ester units percent in the polymer of the specified Example (based on total polymer units), (2) the type of alkyl ester that is present as a modified imide group in the percent amount specified in the preceding column entry, (3) the percent carbamate units percent in the polymer of the specified Example (based on total polymer units), (2) the type of carbamate that is present as a modified imide group in the percent amount specified in the preceding column entry,

TABLE 2

| Example | Percent alkyl ester | Type alkyl ester | Percent carbamate | Type carbamate |
|---|---|---|---|---|
| 25 | 50 | tert. butyl | 50 | phenyl |
| 26 | 50 | tert. butyl | 50 | benzyl |
| 27 | 50 | tert. butyl | 50 | 1-methylbenzyl |
| 28 | 50 | tert. butyl | 50 | 1,1 dimethyl benzyl |
| 29 | 50 | tert. butyl | 50 | 2-phenylethyl |
| 30 | 75 | tert. butyl | 25 | 2-napthylene |
| 31 | 75 | tert. butyl | 25 | 9-methyleneanthracene |
| 32 | 75 | tert. butyl | 25 | phenyl |
| 33 | 75 | tert. butyl | 25 | benzyl |
| 34 | 75 | tert. butyl | 25 | 1-methylbenzyl |
| 35 | 75 | tert. butyl | 25 | 1,1 dimethyl benzyl |
| 36 | 75 | tert. butyl | 25 | 2-phenylethyl |
| 37 | 75 | tert. butyl | 25 | 2-napthylene |
| 38 | 75 | tert. butyl | 25 | 9-methyleneanthracene |
| 39 | 25 | tert. butyl | 75 | phenyl |
| 40 | 25 | tert. butyl | 75 | benzyl |
| 41 | 25 | tert. butyl | 75 | 1-methylbenzyl |
| 42 | 25 | tert. butyl | 75 | 1,1 dimethyl benzyl |
| 43 | 25 | tert. Butyl | 75 | 2-phenylethyl |
| 44 | 25 | tert. Butyl | 75 | 2-napthylene |
| 45 | 25 | tert. Butyl | 75 | 9-methyleneanthracene |

EXAMPLE 46

Synthesis of Styrene/Maleimide Copolymer

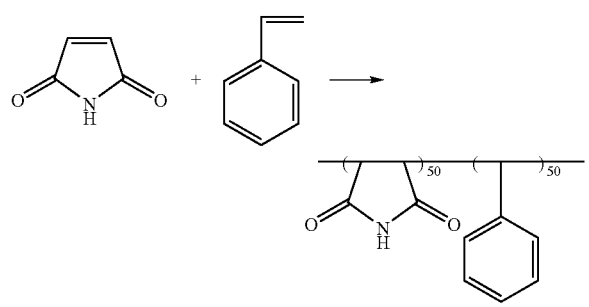

To a 250 mL three necked round bottom flask equipped with silicon oil temperature controlled bath, condenser, magnetic stirrer, thermometer and nitrogen blanket was added styrene (4.85 g), maleimide (5.15 g) and tetrahydrofuran (22.4 g). The bath temperature was set to 65° C. to bring the flask to reflux. While heating, a 10% solution of Vazo 67 (0.95 g) in tetrahydrofuran was prepared. When the monomer solution was at reflux, 80% solution of the initiator was charged to the flask. The polymer solution was held for 1 hour 30 minutes at reflux, this was then followed by another addition of initiator (20%) solution and the reaction held for 18 hours at this temperature. The reaction solution was cooled and the product precipitated into hexanes. Upon drying 10 g of product was recovered. GPC analysis revealed that the obtained polymer had a weight average molecular weight (Mw) of about 70,000 and a polydispersity (Mw/Mn) of 3.3.

EXAMPLE 47

Alkylation of Styrene/Maleimide Copolymer and its Thermal Decomposition

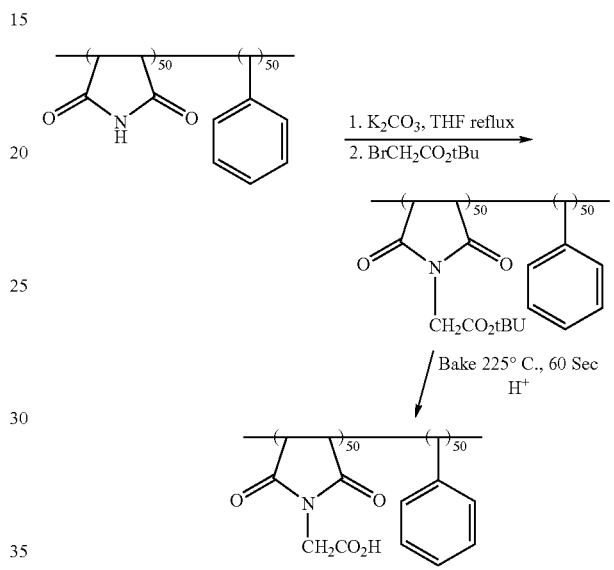

In a 250 mL three necked round bottom flask equipped with a magnetic stirrer and over head condenser, 2.5 g of Styrene/Maleimide copolymer (0.025 Moles) were dissolved in tetrahydrofuran and stirred at room temperature for ten minutes. 2.65 g (0.019 Moles) of $K_2CO_3$ was charged into the reaction mixture and further stirred for 10 minutes. 3.7 g (0.019 Moles) of t-Butyl bromoacetate was then slowly added to the reaction mixture over a period of 15 minutes while stirring. The mixture was then placed in an oil bath set at 75° C. and stirred at this temperature for 23 hours. The reaction was quenched by pouring the mixture slowly into 500 mL of 0.1% HCl solution and stirred for 10 hours. The precipitate was filtered and placed in a flask and covered with 500 mL of 0.1% HCl solution spiked with 5% methanol so as to dissolve the unreacted t-Butyl bromoacetate. This solution was stirred over 12 hours, the precipitate filtered in a Buchner, and rinsed with lots of water. The precipitate was then dried overnight at 50° C. under vacuum.

EXAMPLES 48 THROUGH 57

Underlying Compositions

In these Examples 48 through 57, each composition was prepared by charging the indicated components into a clean bottle without regard to order of addition. The samples were shaken or placed on rollers until completely dissolved. Each sample was then passed through a 0.2 μm PTFE membrane filter into a clean bottle.

Results as set forth in Table 1 below demonstrate polymer insolubility to a typical resist solvent and to a developer after a thermal treatment.

Polymers of Example 1 and 3 were each dissolved in ethyl lactate. To the solution of Example 48 to 52 about 1 weight percent of dodecylbenzene sulfonic acid with amine was added to form 10 weight percent solutions. To the solution of Example 53 to 57 about 3 weight percent of dodecylbenzene sulfonic acid with amine was added. The solutions were spin coated on 4 inch silicon wafer and baked for one minute at the indicated temperature. One wafer of each set was covered with a puddle of the indicated solvent for 60 seconds and then spun dry. The developer was 0.26N tetramethylammonium hydroxide, TMAH, solution. Film thickness (FT) was measured after the bake and after the solvent or developer exposure using a NANOSPEC 300 instrument. In Table 3 below, the solvent is Propylene glycol monomethyl ether acetate is referred to as PGMEA and methyl hydroxy isobutyrate is referred to as HBM.

TABLE 3

| Example No. | FT After 225° C./60 sec Å | Solvent | FT After 60 sec. Soak Å | FT Loss Å |
|---|---|---|---|---|
| 48 | 2931 | Ethyl Lactate | 2701 | 230 |
| 49 | 2870 | PGMEA | 2849 | 21 |
| 50 | 2855 | Cyclohexanone | 2850 | 5 |
| 51 | 2872 | HBM | 2865 | 7 |
| 52 | 2880 | CD26 | 0.0 | 2880 |
| 53 | 3151 | Ethyl Lactate | 2652 | 499 |
| 54 | 3247 | PGMEA | 3196 | 51 |
| 55 | 3132 | HBM | 3137 | +5 |
| 56 | 3134 | 2-Heptanone | 3137 | +3 |
| 57 | 3100 | CD26 | 0 | 3100 |

EXAMPLE 58

Planarization

Coating composition of Example 4 was spin coated on substrate, baked at 225° C./60 seconds. Film thickness is 300 nm. Substrate topography is 150 nm via, 150 nm pitch, 400 nm deep. Isolated trench is 5000 nm. Scanning electron micrographs of substrate overcoated with this coating composition are shown in FIGS. 1A, 1B and 1C.

EXAMPLES 59-61

Reactive Etch

Polymer solutions of Example 1 were spin coated onto 8 inch silicon wafers to give about 3000 Å thick films. The wafers were than subjected to several different etch conditions and etch rates measured. Results are set forth in the following Table 4.

TABLE 4

| Example No. | Plasma Composition | Etch Rate (nm/min.) |
|---|---|---|
| Example 59 | $O_2$/CO | 1229 |
| Example 60 | $CF_4/O_2$/Ar | 175 |
| Example 61 | $H_2/N_2$ | >1600 |

EXAMPLE 62

Lithographic Processing

This example shows use of an underlying coating composition of the invention as an underlayer/anti reflective layer to a 193 nm resist.

Process Conditions

1) Underlayer: 215 nm coating layer of Example 5 is thermally treated at 200° C./60 seconds on a vacuum hotplate;

2) Photoresist: 260 nm coating layer of an acrylate-based 193 nm photoresist soft-baked at 120° C./60 seconds on a vacuum hotplate;

3) Exposure: the applied photoresist layer is exposed to patterned 193 nm radiation;

4) Post-Exposure Bake: 120° C./60 seconds;

5) Development: the latent image is developed with 0.26N aqueous alkaline developer to provide a photoresist relief image.

What is claimed is:

1. A method of preparing an electronic device, comprising:

applying an organic composition layer on a substrate, the organic composition comprise one or more resins with modified glutarimide groups;

thermally treating the applied organic composition layer prior to applying a photoresist composition, wherein the thermal treatment does not increase molecular weight of the one or more resins more than 50 percent and causes a de-blocking rejection of the modified glutarimide groups to provide carboxyl and/or sulfonic acid moieties, and the organic composition being free of a crosslinker; and applying a photoresist composition above the organic composition.

2. The method of claim 1 wherein the modified glutarimide groups are substituted with ester groups or acetal groups.

3. The method of claim 1 wherein the organic composition comprises one or more resins with one or more chromophore groups.

4. The method of claim 1 wherein the thermal treatment does not increase molecular weight of the one or more resins more than 20 percent.

5. The method of claim 1 wherein the modified glutarimide groups comprise groups of the formula —C(═O)NRC(═O)— where R is other than hydrogen.

6. The method of claim 1 further comprising exposing the applied photoresist composition to activating radiation through a mask and developing the exposed photoresist with aqueous alkaline developer wherein the aqueous alkaline developer removes the photoresist and the underlying organic composition in the same step.

7. The method of claim 1 wherein the thermal treatment causes a de-blocking rejection of the modified glutarimide groups to provide carboxyl moieties.

* * * * *